US007189929B2

(12) United States Patent
Benson

(10) Patent No.: US 7,189,929 B2
(45) Date of Patent: Mar. 13, 2007

(54) FLEXIBLE CIRCUIT WITH COVER LAYER

(75) Inventor: Brad Benson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 137 days.

(21) Appl. No.: 10/759,363

(22) Filed: Jan. 16, 2004

(65) Prior Publication Data

US 2005/0155788 A1   Jul. 21, 2005

(51) Int. Cl.
*H01L 23/28* (2006.01)

(52) U.S. Cl. ............... 174/521; 174/262; 174/525; 174/546; 174/254

(58) Field of Classification Search ............. 174/254, 174/256, 268, 117 F, 262, 117 FF; 361/749–751
See application file for complete search history.

(56) References Cited

U.S. PATENT DOCUMENTS

| | | | | |
|---|---|---|---|---|
| 4,098,628 A | * | 7/1978 | Walton | 156/52 |
| 4,692,566 A | * | 9/1987 | Kauffman | 174/117 FF |
| 5,221,859 A | * | 6/1993 | Kobayashi et al. | 257/676 |
| 5,729,897 A | * | 3/1998 | Schmidt et al. | 29/852 |
| 5,894,409 A | * | 4/1999 | Tanaka | 361/749 |
| 6,099,745 A | | 8/2000 | McKenney et al. | |
| 6,194,777 B1 | * | 2/2001 | Abbott et al. | 257/666 |
| 6,204,456 B1 | * | 3/2001 | Lauffer et al. | 174/262 |
| 6,320,137 B1 | | 11/2001 | Bonser et al. | |
| 6,372,992 B1 | * | 4/2002 | Yang | 174/117 F |
| 6,423,470 B1 | | 7/2002 | Scheibner et al. | |
| 6,495,764 B1 | * | 12/2002 | Hori | 174/117 F |
| 6,617,518 B2 | * | 9/2003 | Ames et al. | 174/254 |
| 6,633,002 B2 | * | 10/2003 | Atou | 174/117 F |
| 2002/0037473 A1 | | 3/2002 | Scheibner et al. | |
| 2002/0108780 A1 | * | 8/2002 | Blackwell et al. | 174/262 |
| 2004/0031619 A1 | * | 2/2004 | Lettmann et al. | 174/117 F |
| 2005/0045374 A1 | * | 3/2005 | Kumar et al. | 174/254 |

* cited by examiner

*Primary Examiner*—Dean A. Reichard
*Assistant Examiner*—Hoa C. Nguyen

(57) ABSTRACT

Embodiments of the present invention provide a flexible circuit at least partially encapsulated by a cover layer. The flexible circuit includes a substrate having one or more openings. One or more electrical conductors are bonded to the top surface of the substrate. A first cover layer is bonded to the top surface of the substrate and to the electrical conductors. A second cover layer is bonded to the bottom surface of the substrate and to the first cover layer through the openings.

9 Claims, 12 Drawing Sheets

SECTION VIEW A-A (TOP VIEW)**

(SIDE VIEW)

(END VIEW)**

(TOP VIEW)**

(SIDE VIEW)**

(END VIEW)**

FLEXIBLE CIRCUIT WITH COVER LAYER

FIELD OF THE INVENTION

The present disclosure relates to flexible circuits, and among other things to improved cover layers for flexible circuits.

BACKGROUND OF THE INVENTION

A flexible circuit typically includes a substrate having one or more electrical conductors, circuits and/or printed circuit boards bonded thereto. The substrate is typically a roll of thick polymer film adapted for processing on reel-to-reel equipment. The reel-to-reel production method provides a cost effective manufacturing means.

To protect the electrical conductors from corrosion, shorting and other environmental factors, a first cover layer is adhered to the surface of the substrate (e.g., top surface) and the one or more electrical conductors. The first cover layer typically has a shrinkage coefficient that is greater than the substrate. Thus, upon cooling after the first cover layer is cured, the first cover layer curls the substrate/electrical conductor/cover layer sandwich structure. Hence, a second cover layer is, typically, adhered to the other surface of the substrate (e.g., bottom surface). The second cover layer provides an offsetting shrinkage coefficient such that the cover layer/substrate/electrical conductor/cover layer sandwich structure remains substantially flat.

The edges of the cover layer, which are in a state of tension due to the difference in shrinkage coefficients of the cover layers and the substrate, are stress concentrators. The stressed state of the cover layers can result in de-bonding during repetitive flexing of the flexible circuit. If the cover layers separate from the substrate, the electrical conductors become exposed subjecting them to corrosion, electrical shorting and the like. Furthermore, debonding may not directly expose the encapsulated part of the flexible circuit. Instead, debonding may deleteriously create a bubble or pocket which can act as a collection site for condensed water or solvent that diffuses through the encapsulating cover layer and can cause the exposure problems mentioned above. Additionally, the edges of the cover layer along the substrate act as capillary wicking paths that cause fluids to migrate along the edges of the cover layer. Such wicking is responsible for deleterious effect such as, for example but not limited to, corrosion and electrical shorting in systems such as inkjet printers where the flexible circuit is utilized to attach the inkjet print head to a printed circuit board.

SUMMARY OF THE INVENTION

Embodiments of the present invention produce a flexible circuit at least partially encapsulated by a cover layer. The cover layer encapsulated flexible circuit provides increased protection against environmental factors such as de-bonding, wicking, corrosion, electrical shorting and the like.

In one embodiment of the present invention, the cover layer encapsulated flexible circuit includes a substrate having one or more openings. One or more electrical conductors are bonded to the top surface of the substrate. A first cover layer is bonded to the top surface of the substrate and to the electrical conductors. A second cover layer is bonded to the bottom surface of the substrate and to the first cover layer through the openings.

In another embodiment of the present invention, the method of fabricating a laminate encapsulated flexible circuit includes bonding one or more electrical conductors to the top surface of a substrate. One or more openings are formed in the substrate. A first cover layer is bonded to the top surface of the substrate, and a second cover layer is bonded to the bottom surface of the substrate and to the first cover layer through said openings.

BRIEF DESCRIPTION OF THE DRAWINGS

The present invention is illustrated by way of example and not by way of limitation, in the figures of the accompanying drawings and in which like reference numerals refer to similar elements and in which.

Prior Art

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1A:
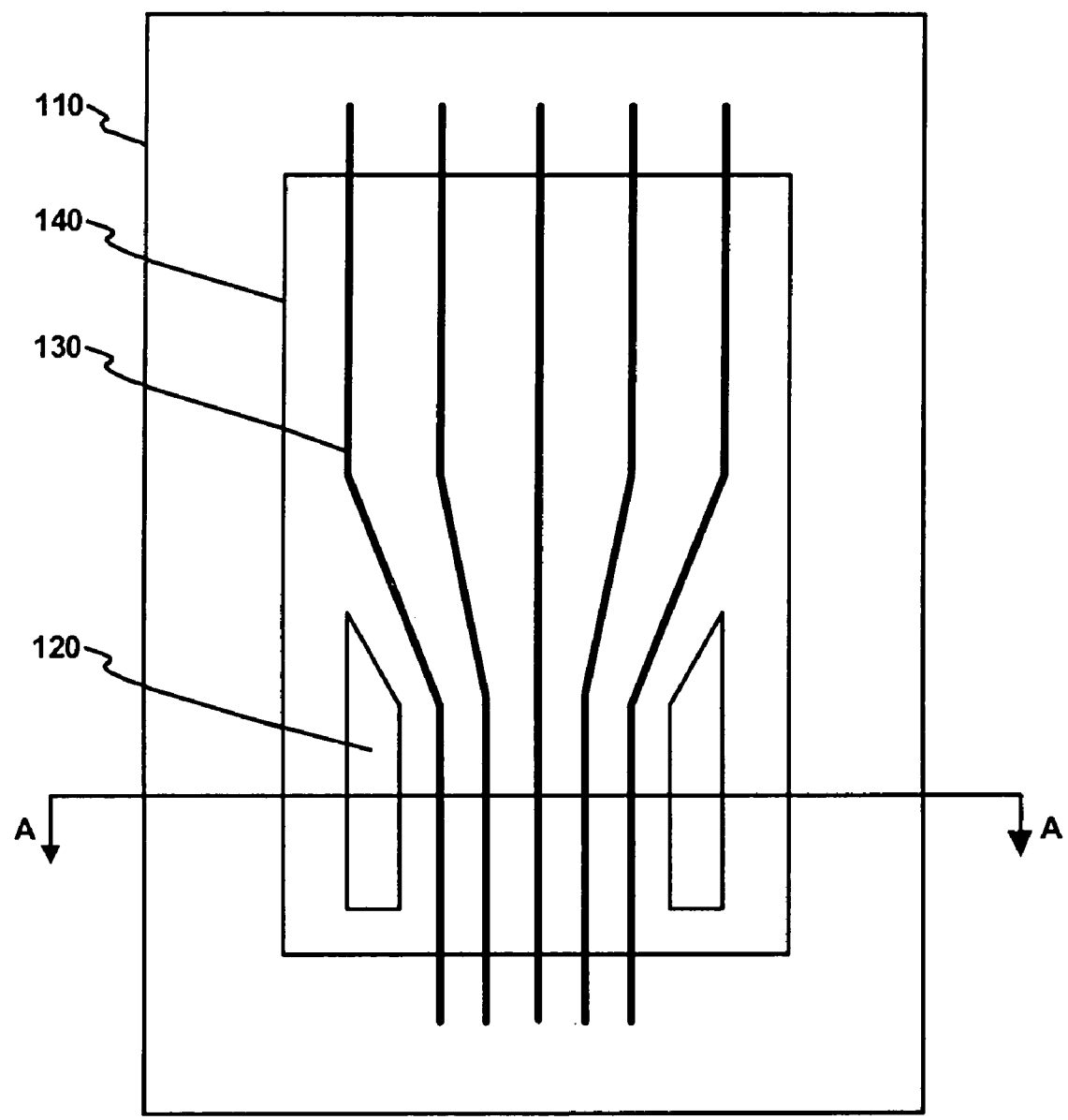
FIGS. 1A–1B show a diagram of a flexible circuit with cover layers, in accordance with an embodiment of the invention.
Figure 1B:
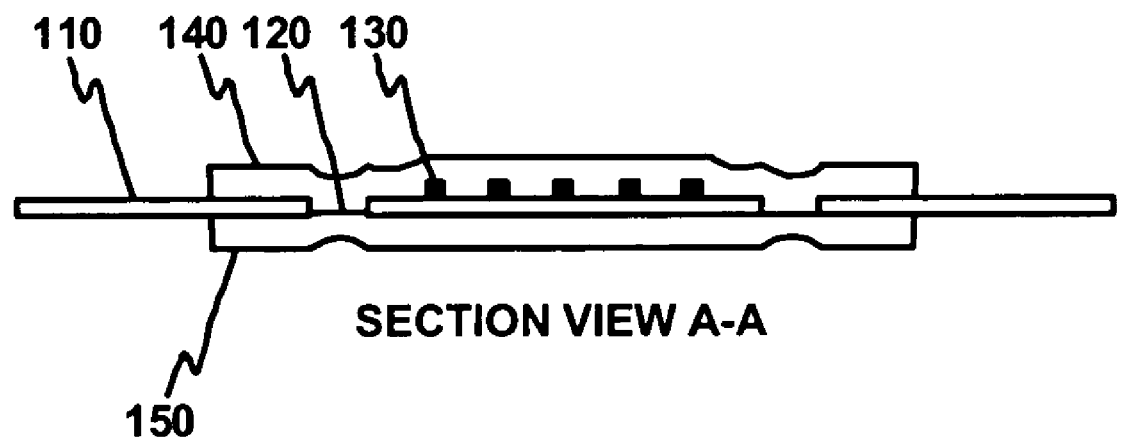

Referring now to FIGS. 1A–1B, a diagram of a flexible circuit with cover layers, in accordance with one embodiment of the invention, is shown. FIG. 1B is a sectional view of FIG. 1A along section line A—A. As depicted in FIGS. 1A–1B, the flexible circuit includes a substrate 110 and one or more electrical conductor-conductors 130 (e.g., traces or interconnects) bonded to the substrate 110. In one embodiment the electrical conductors 130 are bonded to a first surface (e.g., top or bottom surface) of the substrate 110. In another embodiment (not shown), a first portion of the traces are bonded to the first surface of the substrate and a second portion (e.g., bottom surface) of the traces are bonded to a second surface of the substrate.

The substrate has one or more openings 120 formed therein. The flexible circuit further includes a first cover layer 140 bonded to the first surface of the substrate 110. A second cover layer 150 is bonded to the second surface of the substrate 110. The first and second cover layers 140, 150 are bonded to each other through the openings 120 in the substrate 110. The first and second cover layer 140, 150 may be chemically resistant polymers for use in ink, or other corrosive fluid, containing environments.

The first and second cover layers 140, 150 form a partial encapsulation of the areas where they bond to each other through the openings 120. The partial encapsulation is adapted to reduce de-bonding of the substrate 110, first cover layer 140 and/or second cover layer 150 from each other. The partial encapsulation is also adapted to interrupt the wicking path formed by the edges of the cover layers 140, 150 bonded to the substrate 110.

Thus, the substrate 110 and the one or more electrical conductors 130 are at least partially encapsulated by the first and second cover layers 140, 150 in the region where the first and second cover layers 140, 150 are bonded to each other. Accordingly, the openings 120, though which the first and second cover layers 140, 150 are bonded to each other, may be located in an environmentally stressed region of the flexible circuit. Environmentally stressed regions may include areas of repetitive flexing, areas that regularly come in contact with contaminants and/or the like. The shape, size, location and number of openings 120 are variables that may be changed to reduce de-bonding, wicking and/or the like for a particular application in which the flexible circuit is utilized. That is, openings 120 may be tailored in size and/or location to ensure that the first and second cover layers, 140 and 150, are bonded to each other to accomplish specific results. As an example, if it is desired to prevent wicking near the bottom of the flexible circuit, then openings 120 may be located near the bottom of the flexible circuit to ensure that the first and second cover layers, 140 and 150, are bonded to each other at that particular region near the bottom of the flexible circuit.

In one embodiment, the substrate 110 is composed of a polymer, such as polyimide or the like. The electrical conductors 130 are composed of a metallic conductor, such as copper (Cu) or gold (Au) plated copper or the like. The electrical conductors 130 are bonded to the substrate 110 by contact bonds, thermal bonds, chemical bonds, adhesive bonds or the like. The first and second cover layers 140, 150 are composed of a polymer. The first and second cover layers 140, 150 are bonded to the substrate 110 by contact bonds, thermal bonds, chemical bonds, adhesive bonds or the like. The first cover layer 140 is bonded to the electrical conductors 130 by contact bonds, thermal bonds, chemical bonds, adhesive bonds or the like.

Figure 2:
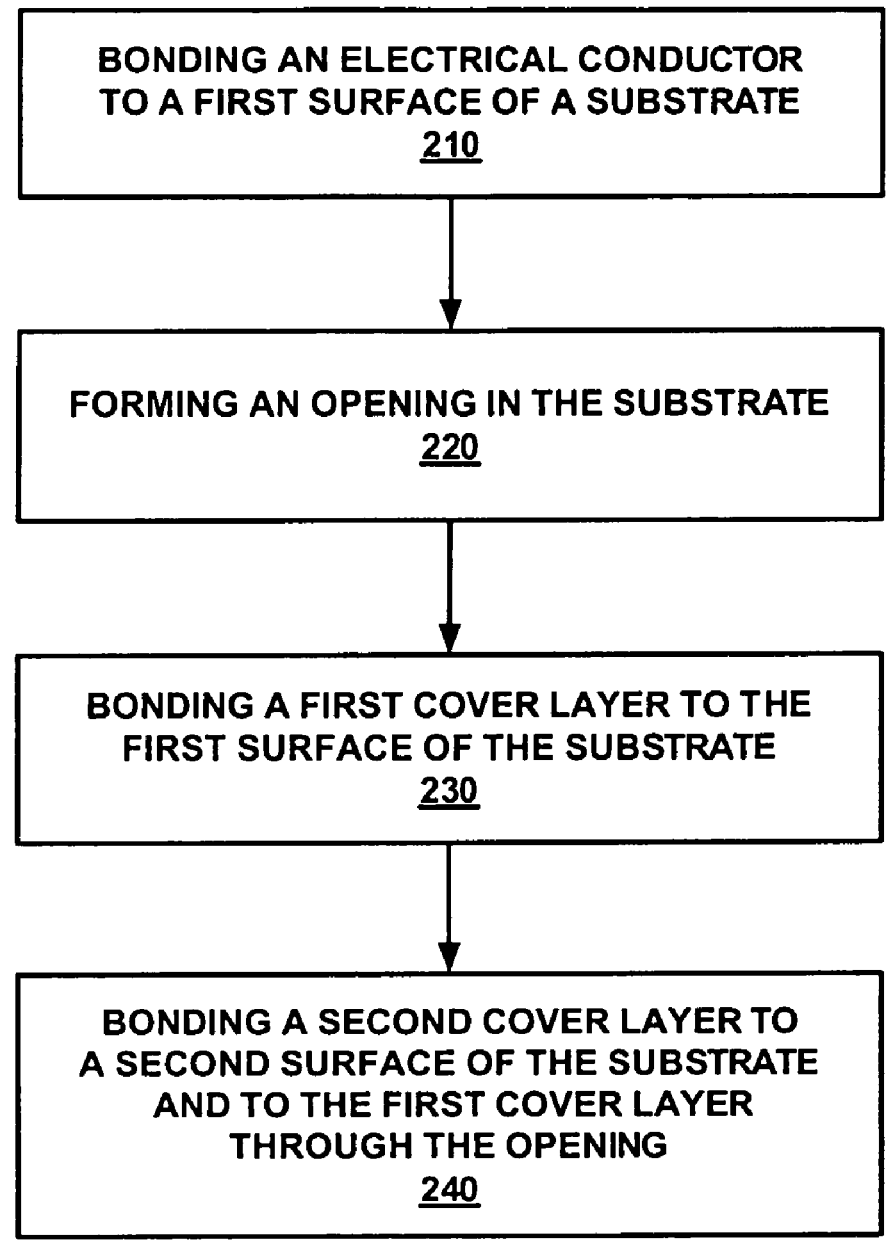
FIG. 2 shows a flow diagram of method of producing a flexible circuit with cover layers, in accordance with an embodiment of the invention.

Referring now to FIG. 2, a flow diagram of method of producing a flexible circuit with cover layers, in accordance with one embodiment of the invention, is shown. As depicted in FIG. 2, the method of producing flexible circuit with cover layers includes bonding one or more electrical conductors 130 to a first surface (e.g., top surface) of a substrate 110, at 210. The electrical conductors may be formed by any well-known additive or subtractive process. In the additive process a seed layer is deposited as a patterned thin film and the metal layers are electroplated on it. In the subtractive process copper foil is laminated to the substrate and chemical etching with photopatterning is used to define the traces. In one embodiment, a metal film of copper is deposited (e.g., sputtered) on a polyimide substrate 110, such as KAPTON by Dupont of Circleville Ohio. The metal film is then patterned to form the one or more electrical conductors 130 by a photoengraving process. The photoengraving process includes the well-known in the art processes of photolithography and selective etching. The patterned metal film is then electroplated to obtain the weight of copper useful for electrical conductors 130. In another embodiment, a metal foil of copper is laminated to the KAPTON substrate 110. The metal foil is patterned to form the one or more electrical conductors 130 by any well-known in the art photoengraving process.

At 220, an opening 120 is formed in the substrate 110. In one embodiment, the opening 120 is cut from the substrate by any well-known in the art masked laser cutting process, scanning laser cutting process, punching the substrate or etching the substrate. In one embodiment, the opening 120 is located in an environmentally stressed region of the flexible circuit. Environmentally stressed regions may include areas of repetitive flexing, areas that regularly come in contact with contaminants and or the like, when the flexible circuit is used in an intended assembly. The shape, size, location and number of openings 120 are variables that may be changed to reduce de-bonding, wicking and/or the like for a particular application in which the flexible circuit is utilized.

At 230, a first cover layer 140 is bonded to the first surface of the substrate 110. In one embodiment, a first film, which is used to form first cover layer 140, of polymer is brought in contact with the top surface of the substrate 110 and the traces 130. The first film may be a chemically resistant polymer when the flexible circuit is to be utilized in an environment where inks or other chemicals are present. The first film is cured by any well-known in the art thermal and/or ultraviolet light exposure process. The first film may also be patterned by any well-known in the art photoengraving process.

At 240 a second cover layer 150 is bonded to a second surface (e.g., bottom surface) of the substrate 110 and to the first cover layer 140 through the opening 120. In one embodiment, a second film, which is used to form second cover layer 150, of polymer is brought in contact with the bottom surface of the substrate 110. The second film is cured by any well-known in the art thermal and/or ultraviolet light exposure process. The second film also bonds (e.g., thermally during curing) to the first film through the opening in the substrate. The second film may also be patterned by any well-known in the art photoengraving process. The second film may be a chemically resistant polymer when the flexible circuit is to be utilized in an environment where inks or other chemicals are present.

It is appreciated that curing the first and second films may be performed at the same time by a single curing process. Curing the first and second films at the same time after they have been bonded together forms a interface therebetween that provides greater adhesion than when one is cured before the other. It is also appreciated that the first and second films may be patterned at the same time by a single patterning process. The first and second cover layer protect the electrical conductors. The first and second cover layers also serve the function of balancing the buckling and/or curling due to thermal expansion mismatch between the substrate and the first and second cover layers. As a result, by bonding the first and second cover layers to each other, the present embodiments decrease the likelihood of buckling and/or curling of either of the first or the second cover layer.

Accordingly, the method produces a cover layer-electrical conductor-substrate-cover layer sandwiched structure. The electrical conductor-substrate portion comprises the flexible circuit. The cover layers 140, 150 cover, and partially encapsulate portions of, the flexible circuit in the region proximate the openings 120 in the substrate 110 through which the two cover layers 140, 150 bond to each other. The partial encapsulation may be adapted to increase protection from environmental factors that cause de-bonding, de-lamination, wicking, corrosion, shorting and the like.

Figure 3A:
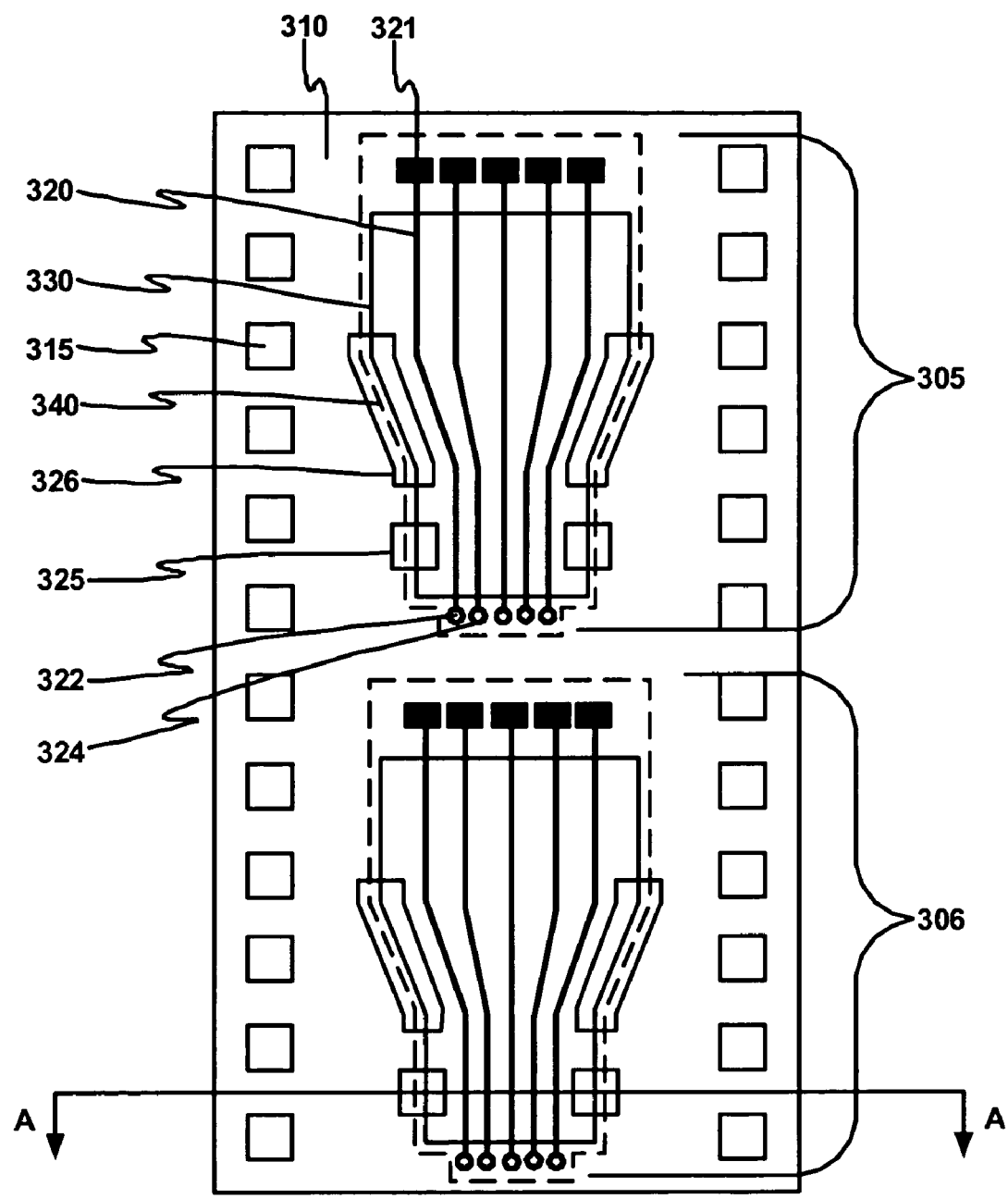
FIGS. 3A–3B show a diagram of a flexible circuit with cover layers, in accordance with an embodiment of the invention.
Figure 3B:
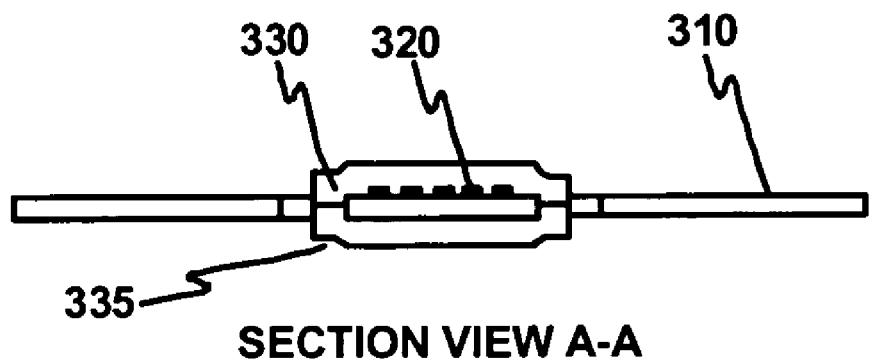

Referring now to FIGS. 3A–3B, a diagram of a flexible circuit with cover layers, in accordance with one embodiment of the invention, is shown. FIG. 3B is a sectional view of FIG. 3A along section line A—A. As depicted in FIGS. 3A–3B, the flexible circuit is formed on a substrate 310. In one embodiment, the substrate 310 is a roll of polyimide film (e.g., Dupont's KAPTON) having a plurality of sprocket type openings 315 therein. The roll having sprocket type openings is adapted for processing the polyimide film on reel-to-reel equipment.

One or more electrical conductors 320 (e.g., traces) are formed on a first surface (e.g., top surface) of the substrate 310. In one embodiment, a copper (Cu) layer is deposited (e.g., sputtering) on the top surface of the polyimide film. Optionally, a gold (Au) layer is deposited on the copper layer. The copper or copper and gold layers are then patterned, utilizing any well-known in the art photoengraving process, to form one or more traces 320 for each flexible circuit 305, 306. In one embodiment, a first end of each trace 320 includes a contact pad 321. The contact pad 321 is adapted for electrical connection (e.g., soldering) to a printed circuit board (not shown). A second end of the trace 320 includes a beam contact 324. The beam contact 324 lines each beam opening 322 and/or encircles each beam opening 322. The beam openings 322 and contacts 324 are adapted for electrical connecting (e.g., tape automated bonding) the traces 320 to an integrated circuit (e.g., inkjet print head—not shown).

One or more openings 325, 326 are formed in the substrate 310. In one embodiment, the openings 325, 326 are cut by any well-known in the art masked laser cutting or scanning laser cutting process, punching the substrate or etching the substrate. In one embodiment, the openings 325, 326 may be cut at the time of cutting other openings, such as the beam openings 322. The shape, size, location and/or number of openings 325, 326 are variables that may be changed to reduce de-bonding, wicking and/or the like for a particular application in which the flexible circuit is utilized. The shape, size, location and/or number of openings for example may be selected to provide the maximum area of encapsulation along the sides of the flexible circuit. The shape, size, location and/or number of openings for example may be selected to minimize sagging, buckling and/or the like of the roll of substrate when processing on the reel-to-reel equipment. Additionally, embodiments of the present invention are also well suited to use with flexible circuits having integrated circuit (ICs) and/or other active or passive components coupled thereto, Furthermore, embodiments of the present invention are also well suited to use with flexible circuits having integrated circuits (ICs) and/or other active or passive components located on either the top and/or the bottom surface of the flexible circuit.

A first cover layer 330 is bonded to the first surface of the substrate 310. In one embodiment, a first film, of ink-resistant polymer, is brought in contact with the top surface of the substrate 310. The first film is cured by any well-known in the art thermal and/or ultraviolet light exposure process. The first film is patterned, utilizing any well-known in the art photoengraving process, to form the first cover layer 330 for each flexible circuit 305, 306.

A second cover layer 335 is bonded to a second surface (e.g., bottom surface) of the substrate 310 and the first cover layer 330 through the openings 325, 326. In one embodiment, a second film, of ink-resistant polymer, is brought in contact with the bottom surface of the substrate 310. The second film bonds to the first film through the openings 325, 326. The second film is cured by any well-known in the art thermal and/or ultraviolet light exposure process. The second film is patterned, utilizing any well-known in the art photoengraving process, to form the second cover layer 335 for each flexible circuit 305, 306.

The first and second cover layer 330, 335 protect the electrical conductors 320. The first and second cover layers 330, 335 also serve the function of balancing the buckling and/or curling due to thermal expansion mismatch between the substrate 310 and the first and second cover layers 330, 335.

Each flexible circuit 305, 306 formed on the substrate 310 is singulated. In one embodiment, each flexible circuit 305, 306 is singulated by any well-known in the art masked laser or scanning laser cutting process. If the first and second cover layers 330, 335 extend beyond the openings 325, 326 (not shown), the cut line is made in the substrate 310 just outside the first and second cover layers 330, 335, and in the first and second cover layers 330, 335 within the openings 325, 326. If the first and second cover layers 330, 335 are patterned such that they only partially extend into the openings 325, 326, the cut line 340 is made within the substrate 310 just outside the first and second cover layers 330, 335, and through the openings 325, 326 just outside the patterned first and second cover layers 330, 335. The cuts are not made within the cover layer-substrate-cover layer sandwich region.

Thus, the substrate 310 and the one or more electrical conductors 320 are at least partially encapsulated by the first and second cover layer 330, 335. Accordingly a first opening 325 may be located in a wicking susceptible area (e.g., an area where a substantial amount of ink from the inkjet print head comes in contact with the flexible circuit). Alternatively or in addition, a second opening 326 may be located in a de-bonding susceptible area (e.g., an area where the flexible circuit is repetitively flexed).

In various embodiments of the present invention, total encapsulation cannot be achieved, because, for example, the flexible circuits need to remain attached to the roll of substrate during reel-to-reel processing (e.g., tape automated bonding of the print head to the flexible circuit). Furthermore, total encapsulation is not possible, in various embodiments, because the flexible circuit ultimately needs to be connected to the printhead. However, the un-encapsulated regions can be located under an existing end encapsulant (e.g., encapsulant applied to an exposed portion of the substrate 310 and electrical conductors 320 and overlapping an adjacent portion of the cover layers 330, 335 after a print head is attached to the flexible circuit 305), or further away from a potentially aggressive environment.

Figure 4A:
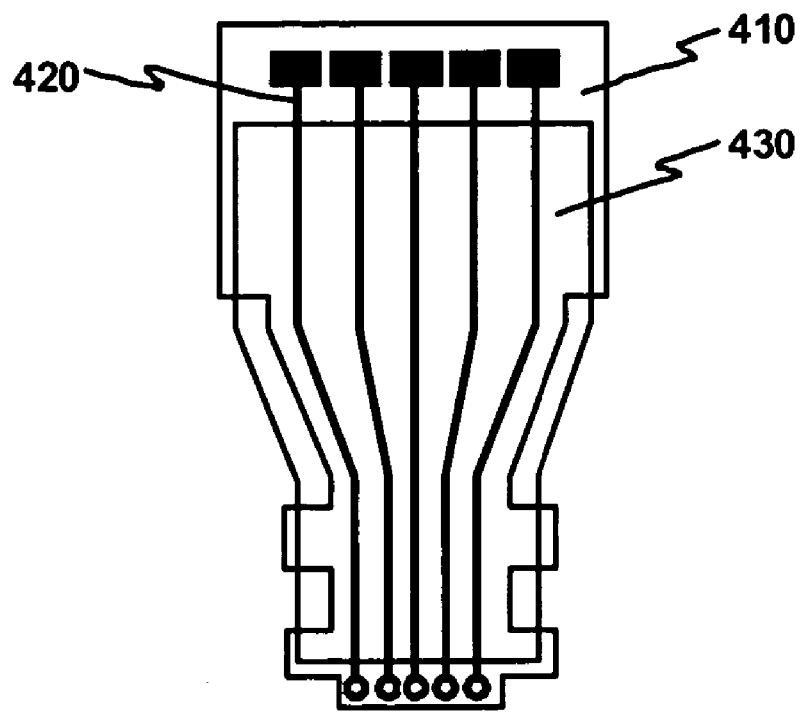
FIGS. 4A–4C show a diagram of a flexible circuit with cover layers, in accordance with an embodiment of the invention.
Figure 4B:
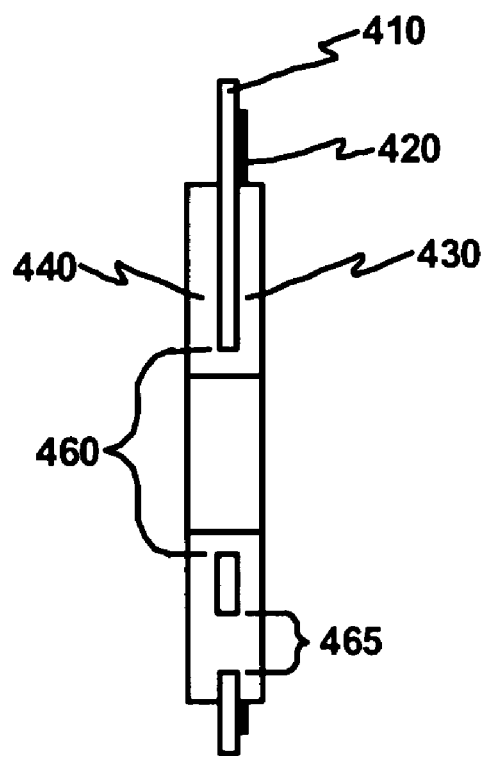
Figure 4C:
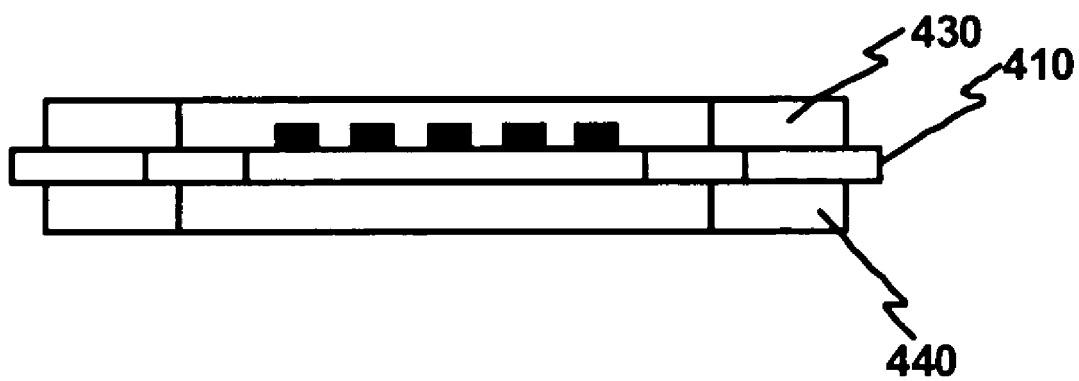

Referring now to FIGS. 4A–4C, a diagram of a flexible circuit with cover layers, in accordance with one embodiment of the invention, is shown. FIG. 4A is a top view, FIG. 4B is a side view, and FIG. 4C is an end view of the flexible circuit. As depicted in FIGS. 4A–4C, the cover layer encapsulated flexible circuit is formed on a substrate 410. One or more electrical conductors 420 are formed on a first surface of the substrate 410. A first cover layer 430 is bonded to the first surface of the substrate 410. A second cover layer 440 is bonded to a second surface of the substrate 410. The first and second cover layers 430, 440 are also bonded to themselves, as shown by regions 460, 465 thereby at least partially encapsulating the substrate 410 and the electrical conductors 420. The one or more regions of encapsulation 460, 465 interrupt the wicking path formed along the side of the cover layer encapsulated flexible circuit. The one or more regions of partial encapsulation 460, 465 also reduce de-bonding of the substrate 410, electrical conductors 420, first cover layer 430 and/or second cover layer 440 from each other.

Figure 5A:
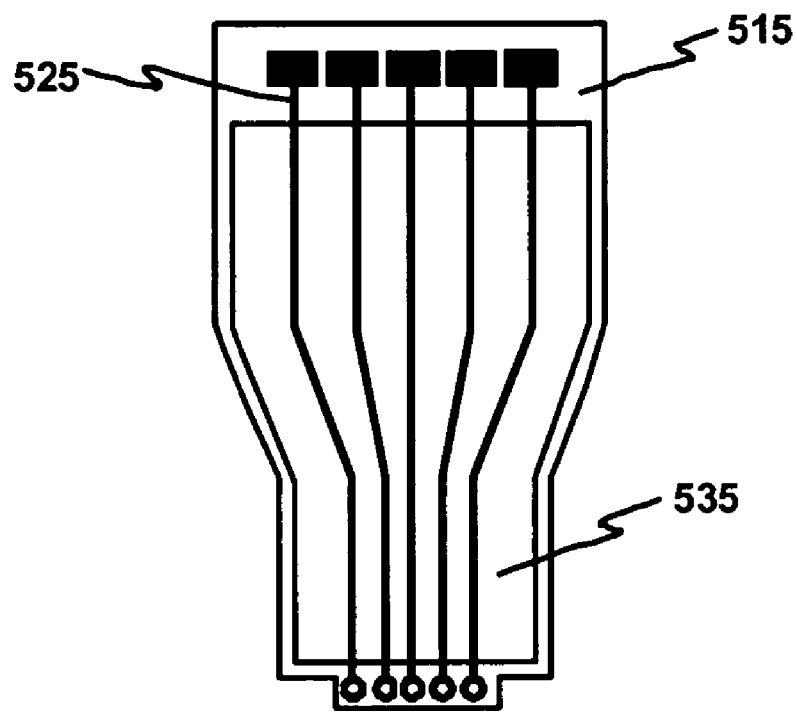
FIGS. 5A–5C shows a diagram of flexible circuit, in accordance with the prior art.
Figure 5B:
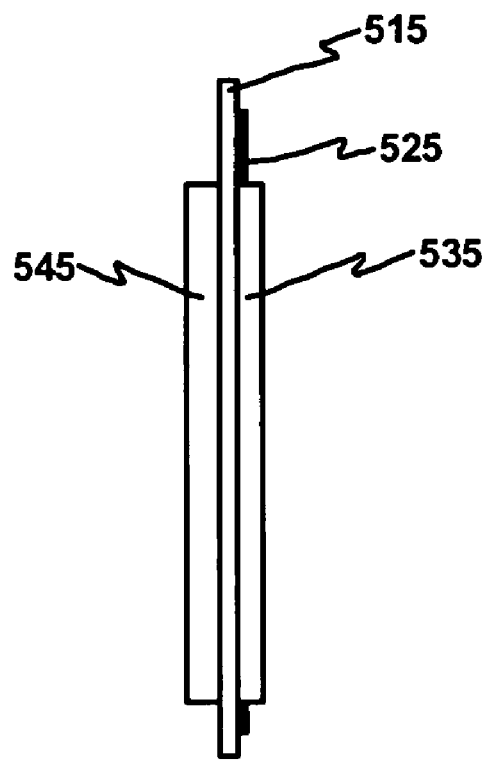
Figure 5C:
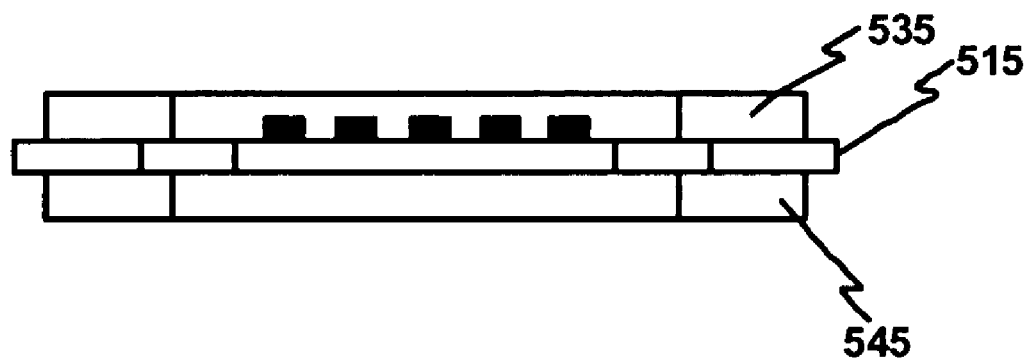

For comparison purposes, a prior art flexible circuit is shown in FIGS. 5A–5C. The first cover layer 535 is bonded to the substrate 515 and the electrical conductors 525. The second cover layer 545 is bonded to the substrate. However, the first and second cover layers 535, 545 are not bonded to each other. Therefore, the substrate 515 and the electrical conductors 520 are not encapsulated therein. The exposed edge of the substrate provides a wicking path that runs the entire length of the flexible circuit. The first and second cover layers 535, 545 also easily de-bond from the substrate and/or electrical conductors because of the weak bond between the cover layer 535, 545 and the substrate 515 and/or electrical conductors 525.

Figure 6:
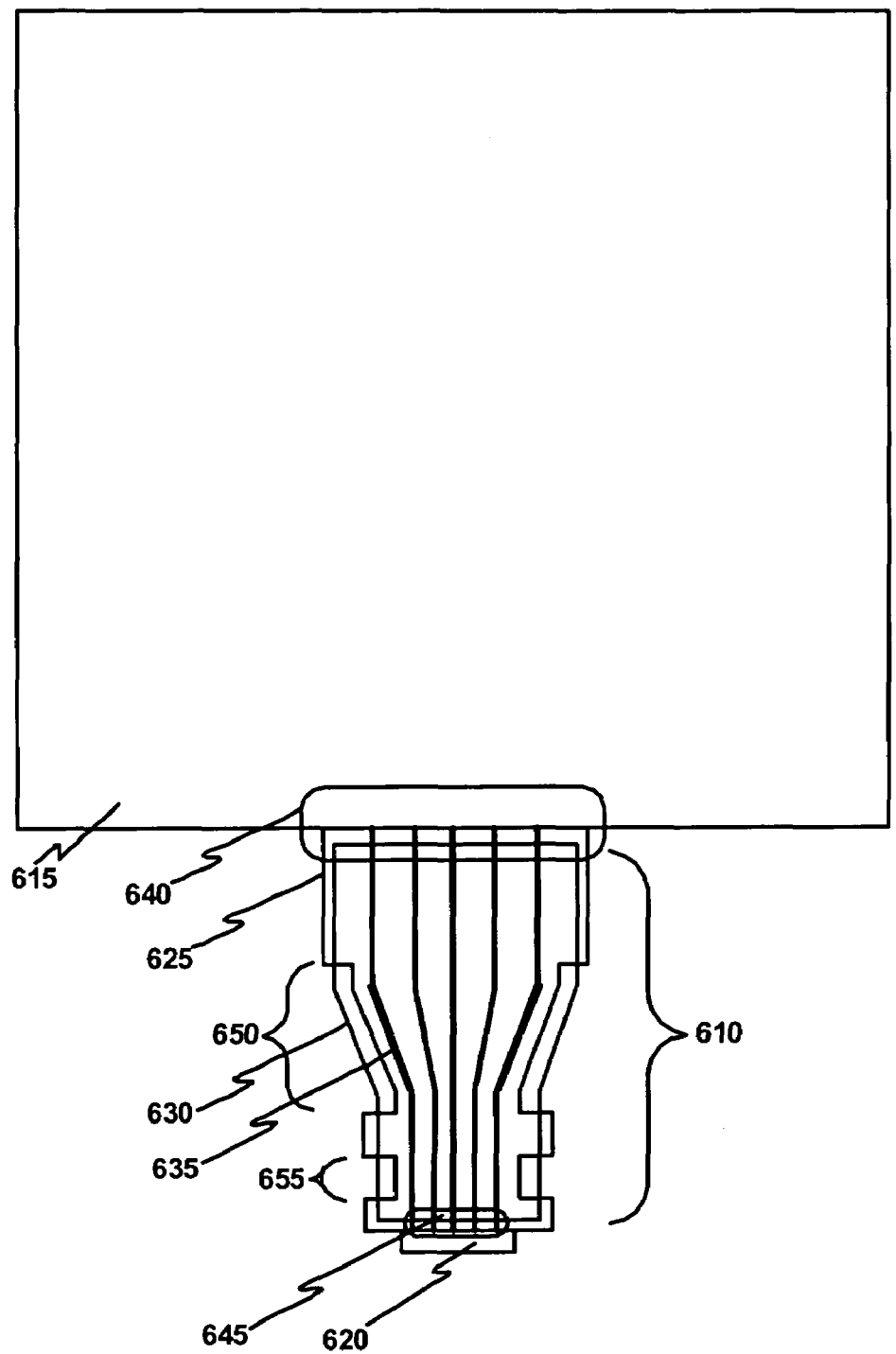
FIG. 6 shows a block diagram of an exemplary flexible circuit assembly, in accordance with one embodiment of the invention.

Referring now to FIG. 6, a block diagram of an exemplary flexible circuit assembly, in accordance with one embodiment of the invention, is shown. As depicted in FIG. 6, the exemplary assembly includes a flexible circuit 610 having a printed circuit board 615 attached at a first end and a print head 620 attached at a second end. The printed circuit 610 includes a substrate 625, a first and second cover layer 630, one or more electrical conductors 635. The first and second cover layers 630 are bonded to themselves along one or more encapsulation regions 650, 655 thereby at least partially encapsulating the substrate 625 and the electrical conductors 635. The one or more regions of partial encapsulation 650, 655 interrupt the wicking path formed along the edges of the cover layers 630 substrate 625 interface. The one or more regions of encapsulation 650, 655 also reduce de-bonding of the substrate 625, electrical conductors 635, and/or cover layers 630 from each other.

Optionally, one or more end encapsulations 640, 645 may be included in the assembly. The end encapsulation 640, 645 cover a portion of the printed circuit board 615 and or print head 620, the exposed portions of electrical conductors 635, and a portion of a first and second cover layers 630 adjacent the first and second ends of the flexible circuit 610. If end encapsulation 640, 645 is utilized, the wicking paths formed along the sides and ends of the flexible circuit 610 is further interrupted. The end encapsulation 640, 645 is also utilized to reduce de-bonding of the substrate 625, electrical conductors 635 and/or cover layers 630 from each other.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. an insulative substrate having a first surface on a first side of said insulative substrate, a second surface on a second side of said insulative substrate opposite said first side, and a peripheral edge, said peripheral edge of said insulative substrate forming at least one notch that defines an open space;
   an electrical conductor line bonded to said first surface of said insulative substrate;
   a first cover layer bonded to said first surface of said insulative substrate and to said electrical conductor line said first cover layer extending beyond said peripheral edge of said insulative substrate at said at least one notch so as to extend into said open space; and
   a second cover layer bonded to said second surface of said insulative substrate, said second cover layer also extending beyond said peripheral edge of said insulative substrate at said at least one notch so as to extend into said open space, said second cover layer being bonded to said first cover layer at said open space such that said first and second cover layers form an encapsulation region that partially encapsulates said insulative substrate.

2. The flexible circuit according to claim 1, wherein said insulative substrate comprises a polymer.

3. The flexible circuit according to claim 1, wherein said electrical conductor line comprises a metallic conductor.

4. The flexible circuit according to claim 1, wherein said first and second cover layers comprise a polymer.

5. The flexible circuit according to claim 1, wherein said first and second cover layers do not extend beyond said peripheral edge of said insulative substrate along at least a portion of said peripheral edge such that said substrate is only partially encapsulated by said first and second cover layers.

6. The flexible circuit according to claim 1, wherein said at least one notch is located in an environmentally stressed region of the flexible circuit.

7. The flexible circuit according to claim 1, wherein said at least one notch comprises an opening that was formed in said insulative substrate and that was cut along a cut line during a singulation process.

8. The flexible circuit according to claim 1, wherein the flexible circuit is adapted for attachment to a printed circuit board.

9. The flexible circuit according to claim 1, wherein the flexible circuit is adapted for attachment to a print head.

* * * * *

UNITED STATES PATENT AND TRADEMARK OFFICE
CERTIFICATE OF CORRECTION

PATENT NO. : 7,189,929 B2 Page 1 of 1
APPLICATION NO. : 10/759363
DATED : March 13, 2007
INVENTOR(S) : Brad Benson It is certified that error appears in the above-identified patent and that said Letters Patent is hereby corrected as shown below:

In column 8, line 8, in Claim 1, before "an" insert -- A flexible circuit, comprising: --.

In column 8, line 17, in Claim 1, after "line" insert -- , --.

Signed and Sealed this

Eighteenth Day of November, 2008

JON W. DUDAS
*Director of the United States Patent and Trademark Office*